United States Patent
Rivero et al.

(10) Patent No.: US 12,057,513 B2
(45) Date of Patent: Aug. 6, 2024

(54) INTEGRATED CIRCUIT INCLUDING A CAPACITIVE ELEMENT AND CORRESPONDING MANUFACTURING METHOD

(71) Applicant: STMicroelectronics (Rousset) SAS, Rousset (FR)

(72) Inventors: Christian Rivero, Rousset (FR); Brice Arrazat, Bouc-bel-air (FR); Julien Delalleau, Marseilles (FR); Joel Metz, Gardanne (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 18/210,155

(22) Filed: Jun. 15, 2023

(65) Prior Publication Data
US 2023/0327028 A1 Oct. 12, 2023

Related U.S. Application Data

(62) Division of application No. 17/366,585, filed on Jul. 2, 2021, now Pat. No. 11,721,773.

(30) Foreign Application Priority Data

Jul. 3, 2020 (FR) ..................................... 2007076

(51) Int. Cl.
| | | |
|---|---|---|
| *H01L 21/00* | (2006.01) |
| *H01L 21/265* | (2006.01) |
| *H01L 21/28* | (2006.01) |
| *H01L 29/423* | (2006.01) |
| *H01L 29/788* | (2006.01) |

(Continued)

(52) U.S. Cl.
CPC ........ *H01L 29/945* (2013.01); *H01L 21/2652* (2013.01); *H01L 28/91* (2013.01); *H01L 29/40114* (2019.08); *H01L 29/4236* (2013.01); *H01L 29/788* (2013.01); *H10B 41/35* (2023.02)

(58) Field of Classification Search
CPC ............. H01L 29/945; H01L 29/40114; H01L 21/2652; H01L 28/91; H01L 29/4236; H01L 29/788; H10B 41/35
See application file for complete search history.

(56) References Cited

U.S. PATENT DOCUMENTS

| | | | |
|---|---|---|---|
| 11,621,222 B2 * | 4/2023 | Marzaki ................ | H01L 29/945 257/532 |
| 11,935,828 B2 * | 3/2024 | Marzaki .............. | H01L 23/5223 |

(Continued)

OTHER PUBLICATIONS

INPI Search Report and Written Opinion for FR Appl. No. 2007076 dated Feb. 18, 2021 (12 pages).

(Continued)

*Primary Examiner* — Richard A Booth
(74) *Attorney, Agent, or Firm* — Crowe & Dunlevy LLC

(57) ABSTRACT

A semiconductor substrate includes excavations which form trenches sunk. A capacitive element includes: a first dielectric envelope conforming to sides and bottoms of the trenches; a first semiconductor layer conforming to a surface of the first dielectric envelope in the trenches; a second dielectric envelope conforming to a surface of the first semiconductor layer in the trenches; and a second semiconductor layer conforming to a surface of the second dielectric envelope in the trenches.

18 Claims, 5 Drawing Sheets

(51) Int. Cl.
*H01L 29/94* (2006.01)
*H01L 49/02* (2006.01)
*H10B 41/35* (2023.01)

(56) References Cited

U.S. PATENT DOCUMENTS

2012/0211865 A1  8/2012  Tian et al.
2013/0161792 A1  6/2013  Tran et al.
2016/0020267 A1  1/2016  Lin
2020/0066922 A1  2/2020  Cheng et al.

OTHER PUBLICATIONS

Klootwijk J.H Ultrahigh Capacitance Density for Multiple Ald-Grown MIM Capacitor Stacks in 3-D Silicon IEEE Electron Device Letters vol. 29 N° Jul. 7, 2008 pp. 740-742.

* cited by examiner

INTEGRATED CIRCUIT INCLUDING A CAPACITIVE ELEMENT AND CORRESPONDING MANUFACTURING METHOD

CROSS REFERENCE TO RELATED APPLICATION

This application is a divisional from U.S. patent application Ser. No. 17/366,585, filed Jul. 2, 2021, which claims the priority benefit of French Application for Patent No. 2007076, filed on Jul. 3, 2020, the contents of which are hereby incorporated by reference in their entireties to the maximum extent allowable by law.

TECHNICAL FIELD

Embodiments and implementations relate to integrated circuits and the methods for manufacturing integrated circuits and, in particular, the implementations of capacitive elements of the MOS type.

BACKGROUND

Conventionally, a capacitive element of the Metal Oxide Semiconductor (MOS) type includes a first electrode formed by a semiconductor substrate and a second electrode formed by a conductive, or semiconductor, layer. A dielectric material is interposed between the first electrode and the second electrode. The interface located facing the first electrode and the second electrode is called capacitive interface and defines the capacitive value of the capacitive element.

A major need of the implementations of capacitive elements is to have the highest possible capacitive value per unit area, referred to herein as "capacitance density."

In conventional architectures, it has been proposed to form the second electrode by filling trenches extending vertically in the substrate in order to increase the surface area of the capacitive interface, thus extended on the outer contour of the trenches in the substrate, and without increasing the surface area occupied on the face of the substrate. The capacitive density of such architectures typically has values ranging from 17 to 25 $fF/\mu m^2$ (femtofarads per square micrometer), for a dielectric material made of silicon oxide having a thickness between 3 and 4 nm.

Increasing the depth of the trenches directly allows for an increase in the capacitive density, but the viability of this approach is limited. Indeed, in the manufacturing methods, the depth of the trenches obtained is directly proportional to the duration of operation of an etching tool.

However, in an industrial line, blocking the use of a tool for a long duration is disadvantageous per se, and can even slow down the entire production line.

For example, it can be considered that starting at a depth of 900 nm (nanometers), the time devoted to the etching of the trenches of the capacitive element is not profitable.

Thus, there is a need to propose architectures of capacitive elements having a greater capacitive density than the conventional techniques, in a viable manner in an industrial manufacturing method.

SUMMARY

According to one aspect, an integrated circuit is proposed including a semiconductor substrate comprising a plurality of excavations in the form of trenches sunk into the substrate substantially perpendicularly to a front face of the substrate. At least one capacitive element includes: a first dielectric envelope covering a part of the front face and conforming to the sides and the bottoms of the trenches; a first semiconductor layer on the first dielectric envelope, covering the part of the front face and conforming to the sides and the bottoms of the first dielectric envelope inside each trench; a second dielectric envelope on the first semiconductor layer, covering the part of the front face and conforming to the sides and the bottoms of the first semiconductor layer inside each trench; and a second semiconductor layer on the second dielectric envelope, covering the part of the front face and completely filling each trench.

Thus, the capacitive interface extends on the one hand over the "outer" surface of the trenches, that is to say the surface formed by the sides and the bottoms of the trenches, and on the other hand over an "inner" surface of the trenches, that is to say the surface formed by the sides and the bottoms of the free spaces inside each trench.

Consequently, the capacitive density is substantially doubled with respect to the conventional techniques in which the trenches are completely filled by a single conductive or semiconductor layer.

The aforementioned part of the front face is a part containing the excavations in the form of trenches, on which the implementation of the capacitive element is defined. Of course, the excavations in the form of trenches are volumes dug in the substrate, from the front face, that is to say openings extended lengthwise and narrow in width. The excavations in the form of trenches are disposed regularly and in parallel lengthwise, so that in a cross-sectional view, the plurality of excavations in the form of trenches traces the shape of a comb, the teeth of which are the parts dug in the substrate. The distance between two neighboring parallel trenches can be substantially equal to the width of a trench.

According to one embodiment, the second semiconductor layer is configured to be electrically connected to the semiconductor substrate.

Indeed, the semiconductor substrate is advantageously incorporated into a first electrode of the capacitive element, the first electrode comprising both the substrate and the second semiconductor layer.

According to one embodiment, the semiconductor substrate includes a doped region having a type of conductivity opposite to the type of conductivity of the substrate, locally at said part of the front face of the substrate.

The doped region forms a source of minority carriers in the semiconductor substrate, which improves the behavior of the MOS capacitive element in inversion mode.

According to one embodiment, the trenches have a depth greater than 500 nanometers (nm). Optionally, the trenches have a depth of less than 1200 nm, or even 900 nm.

The example of 500 nm can correspond to a gain in manufacturing time, and the example of 900 nm can correspond to a gain in the capacitive density.

Indeed, the depth chosen is the result of a compromise between the value of the capacitive density and the time allocated to the etching of the trenches. Thus, a relatively small depth of 500 nm is advantageous from the point of view of the etching time, and remains advantageous from the point of view of the value of the capacitive density because the surface of the capacitive interface is doubled by the proposed architecture.

The depth of 900 nm is a non-limiting example of a limit coming from the etching time of the trenches, and can correspond to an example of a current manufacturing method. Of course, if the context of the industrial production line allows a longer duration for the etching, or if faster etching techniques are developed, the trenches can have a depth greater than 900 nm without any particular constraint.

According to one embodiment, the trenches have a width between 100 nanometers and 300 nanometers.

According to one embodiment, the trenches are spaced apart one by one by a volume of the substrate having a width between 100 nanometers and 300 nanometers.

These embodiments are advantageous in terms of compactness in the architecture of the plurality of excavations in the form of trenches.

According to one embodiment, the first dielectric envelope is made of silicon dioxide and/or the second dielectric envelope is made of silicon dioxide.

According to one embodiment, the first semiconductor layer is made of polycrystalline silicon and/or the second semiconductor layer is made of polycrystalline silicon.

These embodiments are advantageous in terms of manufacturing cost, given that the techniques for forming layers of silicon dioxide and of polycrystalline silicon are perfectly mastered and can moreover be typically provided in the methods for manufacturing other elements of integrated circuits, and can thus optionally be shared.

According to one embodiment, the integrated circuit conjointly comprises a non-volatile memory including non-volatile memory cells and a logic part, and: said plurality of excavations in the form of trenches have the same nature and the same depth as a trench housing a vertical gate region of a buried access transistor of the memory cells; and/or said first dielectric envelope has the same nature and the same thickness as a layer of tunnel dielectric between a channel region and a floating gate of a floating-gate transistor of the memory cells; and/or said first semiconductor layer has the same nature and the same thickness as a floating-gate region on the layer of tunnel dielectric of the floating-gate transistor of the memory cells; and/or said second dielectric envelope has the same nature and the same thickness as a layer of gate dielectric of a low-voltage transistor of the logic part, or the same nature and the same thickness as a control-gate dielectric layer, located between the floating gate and a control gate of the floating-gate transistor of the memory cells; and/or said second semiconductor layer has the same nature and the same thickness as a gate region of the low-voltage transistor of the logic part, or the same nature and the same thickness as the control gate of the floating-gate transistor of the memory cells.

According to one embodiment, the integrated circuit conjointly comprises a non-volatile memory including non-volatile memory cells, and said region doped locally at said part of the front face of the substrate has the same nature and the same concentration as a doped region near a drain region and facing an injection window located in a tunnel dielectric layer of a floating-gate transistor of the memory cells.

According to one embodiment, the second semiconductor layer does not completely fill each trench, but conforms to the sides and the bottoms of the second dielectric envelope inside each trench, and said at least one capacitive element further includes at least one third assembly of a third dielectric envelope and of a third semiconductor layer, each comprising: a third dielectric envelope on a third semiconductor layer of another third assembly, covering the part of the front face and conforming to the sides and the bottoms of the third semiconductor layer of said other third assembly, inside each trench; a third semiconductor layer on the respective third dielectric envelope, covering the part of the front face and conforming to the sides and the bottoms of the respective third dielectric envelope inside each trench; among which, however: a first third dielectric layer rests on the second semiconductor layer, covers the part of the front face and conforms to the sides and the bottoms of the second semiconductor layer, inside each trench; and a last third semiconductor layer rests on a respective last third dielectric envelope, covers the part of the front face and completely fills each trench.

According to another aspect, a method for manufacturing an integrated circuit comprising a formation of at least one capacitive element is proposed, comprising: etching, in a semiconductor substrate, a plurality of excavations in the form of trenches sunk into the substrate substantially perpendicularly to a front face of the substrate; forming a first dielectric envelope covering a part of the front face and which conforms to the sides and the bottoms of the trenches; forming a first semiconductor layer on the first dielectric envelope, covering the part of the front face and which conforms to the sides and the bottoms of the trenches while leaving a free space inside each trench; forming a second dielectric envelope covering the first semiconductor layer on the part of the front face and on the sides and the bottoms of the free spaces left inside each trench; and forming a second semiconductor layer on the second dielectric envelope, covering the part of the front face and filling the free spaces left inside each trench.

According to one embodiment, the method further comprises an electric connection of the second semiconductor layer to the semiconductor substrate.

According to one embodiment, the method further comprises implanting dopants having a type of conductivity opposite to the type of conductivity of the semiconductor substrate, locally at said part of the front face of the substrate.

According to one embodiment, the trenches are etched in such a way as to have a depth greater than 500 nanometers.

According to one embodiment, the trenches are etched in such a way as to have a width between 100 nanometers and 300 nanometers.

According to one embodiment, the trenches are etched in such a way as to be spaced apart one by one by a volume of the substrate having a width between 100 nanometers and 300 nanometers.

According to one embodiment, the first dielectric envelope is formed from silicon dioxide and/or the second dielectric envelope is formed from silicon dioxide.

According to one embodiment, the first semiconductor layer is formed from polycrystalline silicon and/or the second semiconductor layer is formed from polycrystalline silicon.

According to one embodiment, the method conjointly comprises forming a non-volatile memory including non-volatile memory cells and a logic part, and wherein: etching the plurality of excavations in the form of trenches is carried out simultaneously with forming trenches intended to house a vertical gate region of a buried access transistor of the memory cells; and/or forming the first dielectric envelope is carried out simultaneously with forming a layer of tunnel dielectric between a channel region and a floating gate of a floating-gate transistor of the memory cells; and/or forming of the first semiconductor layer on the first dielectric envelope is carried out simultaneously with forming a floating-gate region on the layer of tunnel dielectric of the floating-gate transistor of the memory cells; and/or forming the second dielectric envelope is carried out simultaneously with forming a layer of gate dielectric of a low-voltage transistor of the logic part, or simultaneously with forming a control-gate dielectric layer between the floating gate and a control gate of the floating-gate transistor of the memory cells; and/or forming the second semiconductor layer on the second dielectric envelope is carried out simultaneously with forming a gate region of the low-voltage transistor of the logic part, or simultaneously with forming the control gate of the floating-gate transistor of the memory cells.

According to one embodiment, the method conjointly comprises forming a non-volatile memory including non-volatile memory cells, and wherein implanting dopants locally at said part of the front face of the substrate is carried out simultaneously with implanting dopants near a drain region and facing an injection window located in a tunnel dielectric layer of a floating-gate transistor of the memory cells.

According to one embodiment, forming the second semiconductor layer does not fill the free spaces left inside each trench but conforms to the sides and the bottoms of the free spaces inside each trench, while leaving a second free space inside each trench, the method further comprising at least one forming a third assembly of a third dielectric envelope and of a third semiconductor layer, each comprising: forming a first third dielectric envelope on a third semiconductor layer of another third assembly, which covers the part of the front face and conforming to the sides and the bottoms of third free spaces inside each trench; forming a third semiconductor layer on the respective third dielectric envelope, which covers the part of the front face and conforming to the sides and the bottoms of the third free spaces left inside each trench while leaving a third free space inside each trench; among which, however: the first forming of a third dielectric layer is carried out on the second semiconductor layer, which covers the part of the front face and conforms to the sides and the bottoms of the second semiconductor layer, inside each trench; the last forming of a third semiconductor layer is carried out on a respective last third dielectric envelope, which covers the part of the front face and completely fills the third free spaces left inside each trench.

BRIEF DESCRIPTION OF THE DRAWINGS

Other advantages and features will appear upon examining the detailed description of embodiments and implementations, in no way-limiting, and the appended drawings, in which.

DETAILED DESCRIPTION

Figure 8:
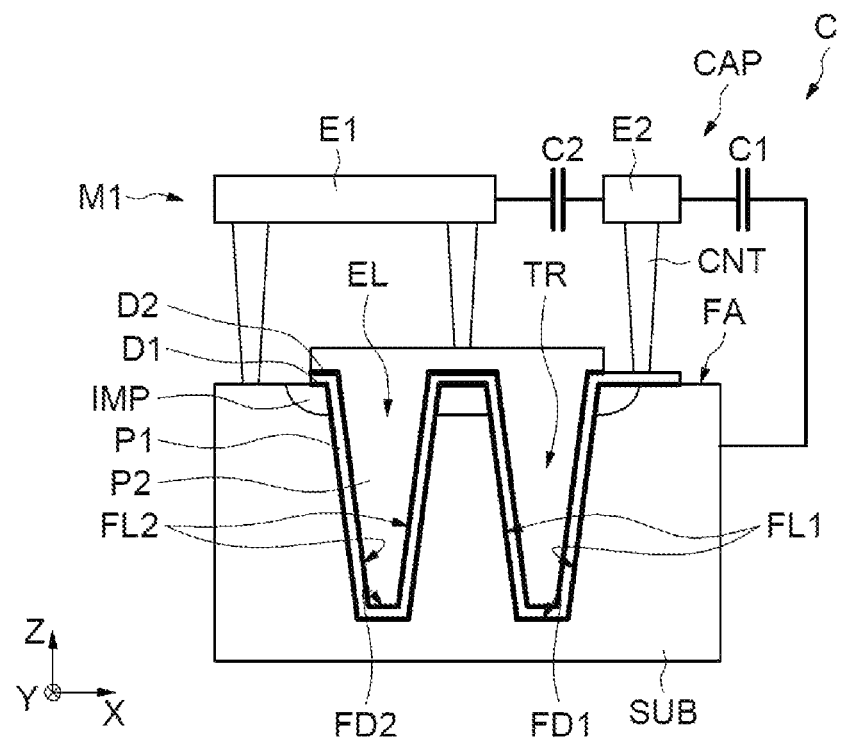
FIGS. 8 and 9 are views of the completed capacitive element.
Figure 9:
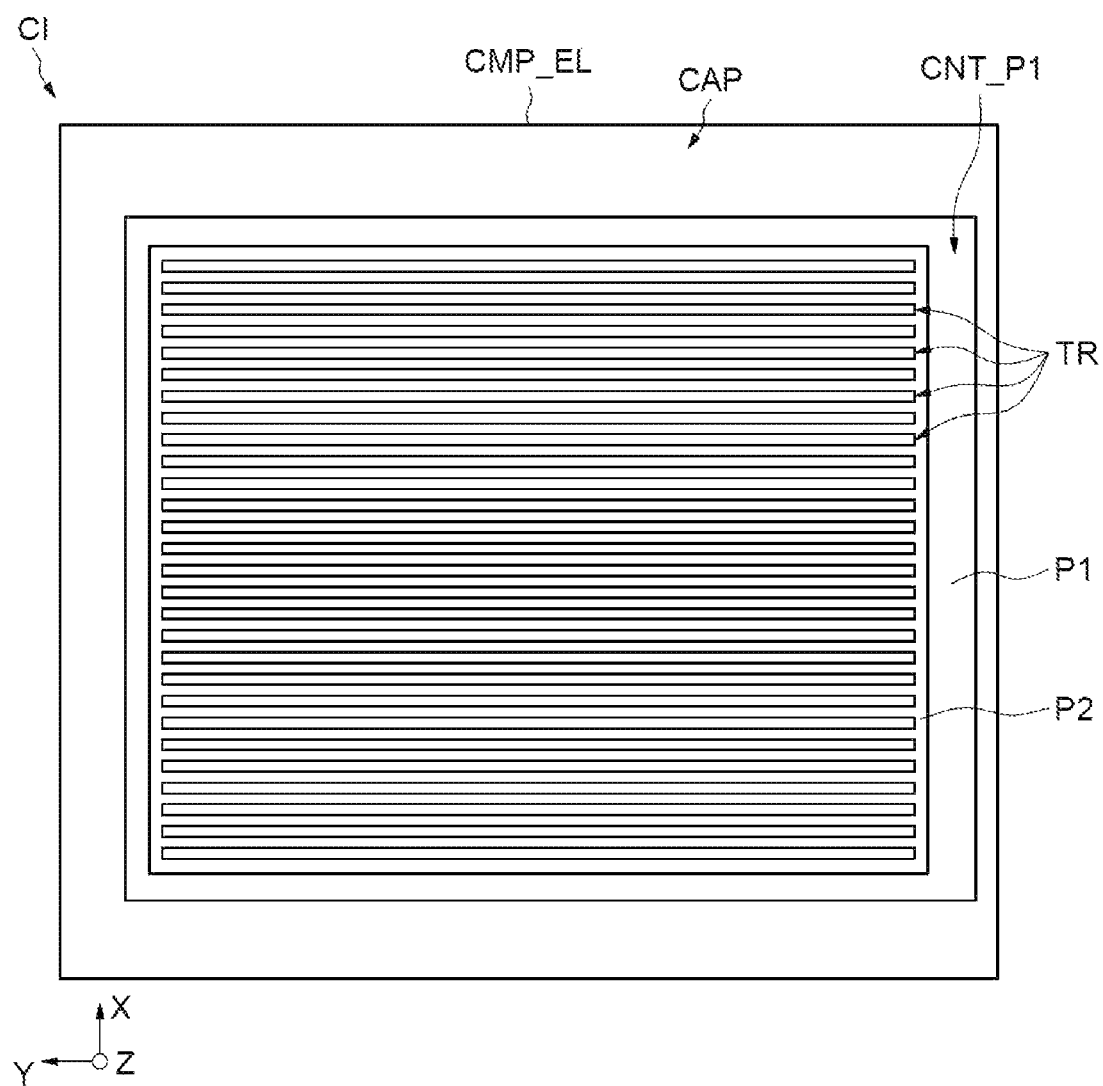

FIGS. 1 to 7 illustrate results of steps of forming a capacitive element within a method for manufacturing an integrated circuit. FIGS. 8 and 9 show views of the completed capacitive element.

Figure 1:
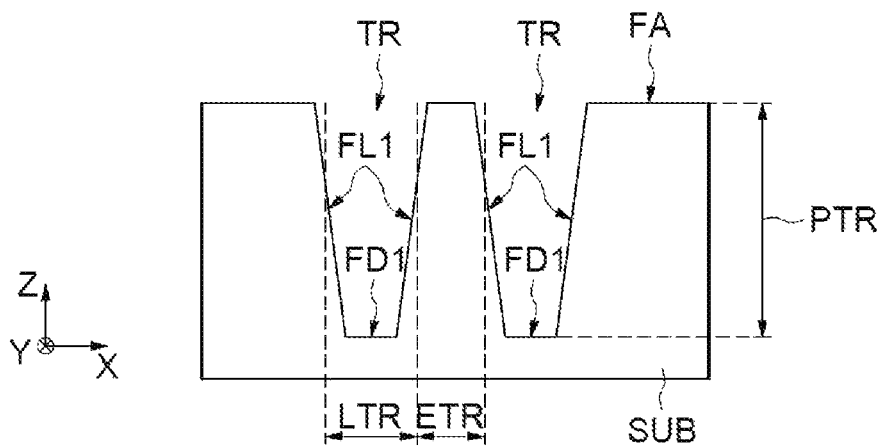
FIGS. 1 to 7 illustrate results of steps of forming a capacitive element.

FIG. 1 shows the result of an etching, in a semiconductor substrate SUB, of a plurality of excavations in the form of trenches TR sunk depth-wise in the substrate SUB perpendicularly to a front face FA of the substrate.

In an orthonormal reference frame X-Y-Z, the front face FA of the substrate SUB is located in a horizontal plane X-Y and the depth perpendicular to the front face FA is directed by the vertical axis Z of the reference frame.

The excavations are etched via an etching tool, typically a chamber for "dry" etching, of the plasma etching type or, for example, of the reactive ion etching (ME) type.

The phenomenon of etching of the material of the semiconductor substrate SUB, typically made of silicon, is obtained by a bombardment of ions, coming from a plasma environment, which produces an effect of mechanical machining of the bombarded material. In the context of RIE etching, ions of the plasma are further chosen to react chemically with the etched material and introduce an additional chemical etching.

By nature, the progression of the etching is relatively slow, and the depth PTR etched is directly proportional to the time of exposure of the substrate SUB to the ionic bombardment.

Dry etching is substantially anisotropic, the etching taking place mainly in the direction in which the ions are bombarded. The sides FL1 of the excavations are thus substantially vertical, slightly inclined. Techniques of passivation of the etched walls can allow to obtain more strictly vertical sides.

An etching mask (not shown) is formed according to a pattern leaving openings in order to position the locations to be etched in the substrate facing the openings.

The etching step is configured to etch the trenches TR to a depth PTR of at least 500 nanometers.

The depth PTR is nevertheless chosen according to a compromise between the value of the capacitive density and the time allocated in the overall manufacturing process to the etching of the trenches. Thus, a relatively small depth of 500 nm has the advantage of being fast and (as will be shown below) of having a good capacitive density. To limit the duration of the etching, it is preferred that the depth PTR be chosen to not exceed 1200 nm, or to not exceed even 900 nm. Of course, if the method for manufacturing the integrated circuit allows a longer duration for the etching, or if etching techniques are faster, the trenches can have a depth greater than 900 nm without any particular constraint. A person skilled in the art will be perfectly capable of parameterizing the compromise on the depth PTR according to their constraints.

The etching step is configured to form a plurality of trenches TR, extending longitudinally in the direction Y, on the entire surface of the front face FA dedicated to the implementation of the capacitive element. The length of the trenches TR can, according to the extension of said dedicated surface, be approximately one micrometer or ten micrometers.

The plurality of trenches TR are disposed regularly and in parallel in terms of their length, and are laterally (direction X) next to one another. Thus, in the cross-sectional view of FIG. 1 (in the plane X-Z) the plurality of excavations in the form of trenches TR traces the shape of a comb, the teeth of which are the parts dug in the substrate SUB. Only two trenches TR have been shown for reasons of conciseness. In practice, the formation of ten to a hundred trenches (like as many teeth of the comb mentioned above) is possible for the formation of an elementary capacitive element on an elementary surface of the front face FA.

Laterally (in the direction X), the trenches TR are etched in such a way as to be much narrower, and have a width LTR for example between 100 nm (nanometers) and 300 nm. Since the inclination of the sides FL1 of the trenches TR is very close to vertical, the difference between the width at the opening located at the front face FA and the width at the bottom FD1 of the trenches will not be taken into consideration.

The trenches TR are spaced apart one by one by a volume of the substrate SUB, the lateral width ETR (in the direction X) of which can be substantially equal to the width of a trench LTR, that is to say for example between 100 nm and 300 nm.

Figure 2:
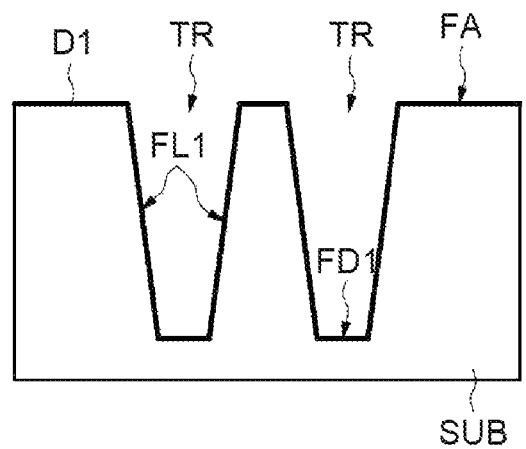

FIG. 2 illustrates the result of a step of forming a first dielectric envelope D1 covering the front face FA and conforming to the sides FL1 and the bottoms FD1 of the trenches TR.

For example, the first dielectric envelope D1 is formed by a thermal growth of silicon dioxide $SiO_2$ and can have a thickness of approximately several nanometers, for example 3.2 nm.

Given the small dimension of the thickness of the first dielectric envelope D1, hereinafter the terms "the sides FL1 and the bottoms FD1 of each trench TR" (or equivalent wording) strictly designate "the sides and the bottoms of the first dielectric envelope D1 inside of each trench" (or equivalent wording).

Figure 3:
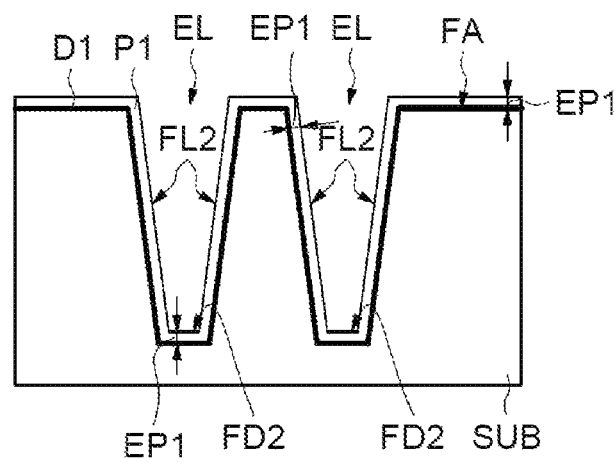

FIG. 3 illustrates the result of a step of forming a first semiconductor layer P1 on the first dielectric envelope D1.

The first semiconductor layer P1 is formed in such a way as to have a constant thickness EP1 on the surfaces that it covers, that is to say the same thickness taken perpendicularly to the surface in question, on the horizontal surfaces (front face FA and bottoms FD1 of the trenches) and on the vertical surfaces (sides FL1 of the trenches).

This type of formation is usually called conformal deposition, for example obtained via chemical vapor deposition (CVD), typically at low pressure (LPCVD) or even under ultra-high vacuum (UHVCVD), or according to other CVD alternatives.

The first semiconductor layer P1 is, for example, formed from polycrystalline silicon.

The constant thickness EP1 is chosen in order for the first semiconductor layer P1 to cover the front face FA and conform to the sides FL1 and the bottoms FD1 of the trenches TR, while leaving a free space EL inside each trench.

In particular, the thickness EP1 is chosen with respect to the width of the trenches LTR (and reciprocally) in such a way that the parts of the first semiconductor layer P1 located on the opposite sides FL1 of a trench TR do not touch each other.

Thus, the free spaces EL have a shape homothetic to the shape of the trenches TR, that is to say each including sides FL2 and a bottom FD2 having a non-zero size.

Figure 4:
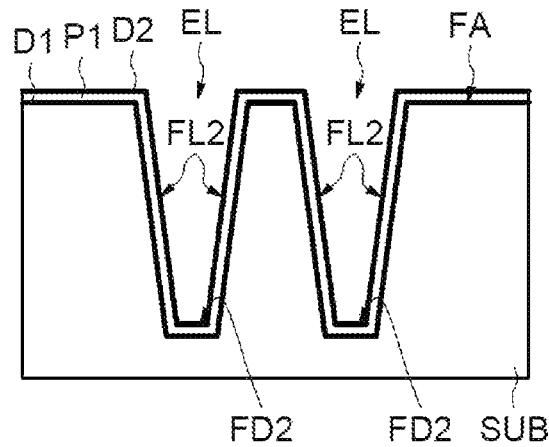

FIG. 4 illustrates the result of a step of forming a second dielectric envelope D2 covering the first semiconductor layer P1 and conforming to the sides FL2 and the bottoms FD2 of the free spaces EL.

Like the first dielectric envelope D1, the second dielectric envelope D2 can be formed by a thermal growth of silicon dioxide $SiO_2$ and can have a thickness of approximately several nanometers, for example 3.2 nm.

Figure 5:
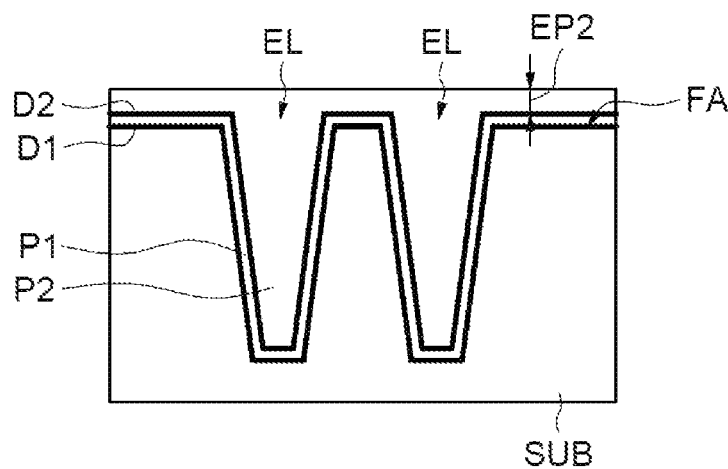

FIG. 5 illustrates the result of a step of forming a second semiconductor layer P2 on the second dielectric envelope D2, covering the front face FA on the stack of the first dielectric envelope D1, the first semiconductor layer P1 and the second dielectric envelope D2.

The second semiconductor layer P2 is formed in such a way as to completely fill the spaces left free EL inside each trench, and is, for example, obtained by an excess deposition overflowing from the free spaces EL. The formation of the second semiconductor layer can be implemented by a CVD technique similar to the formation of the first semiconductor layer P1.

The second semiconductor layer P2 is, for example, made of polycrystalline silicon and can have a thickness of substantially 150 nm on the horizontal part covering the front face FA.

Figure 6:
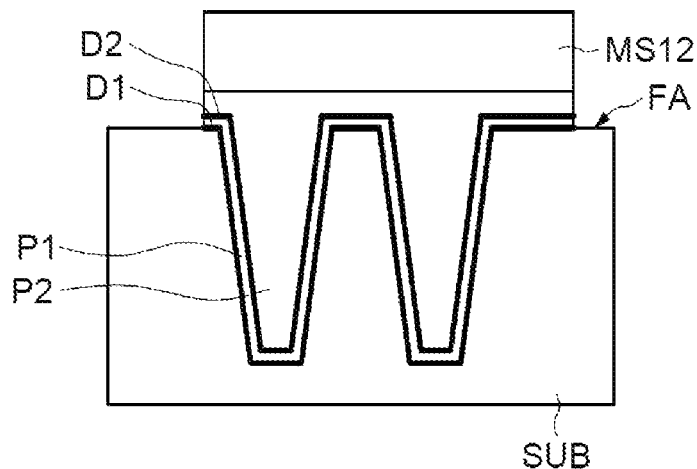

FIG. 6 illustrates the result of a step of etching of the structure formed in relation to FIG. 5, in such a way as to locate the stack of the first dielectric envelope D1, the first semiconductor layer P1, the second dielectric envelope D2 and the second semiconductor layer P2 on a part of the front face FA in which the plurality of trenches TR are located.

In this respect, a mask MS12 is formed, for example made of photosensitive resin, in such a way as to cover said part of the front face FA covering the trenches TR, and the non-masked stack (D1-P1-D2-P2) is removed by time-controlled dry etching to remove the thickness of the layers deposited until the front face FA of the substrate SUB is reached.

After the etching, the mask MS12 is, of course, removed, typically by a selective chemical reaction.

Figure 7:
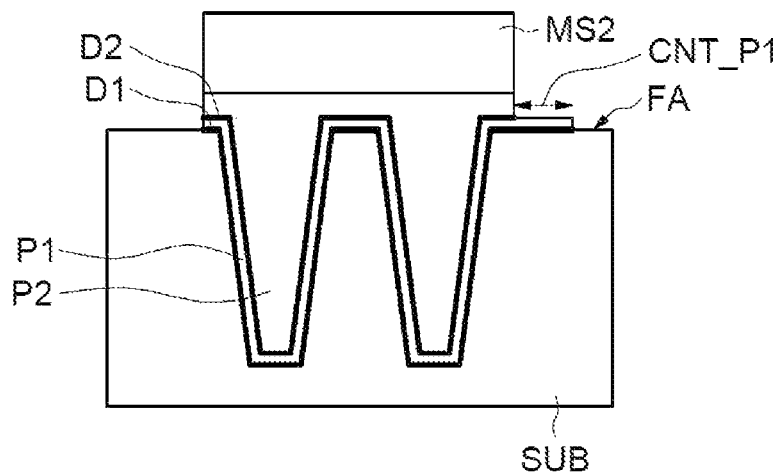

FIG. 7 illustrates the result of another etching step allowing to form zones of contact CNT_P1 for the first semiconductor layer P1.

In this respect, another mask MS2 is formed, for example made of photosensitive resin, in such a way as to cover the structure formed in relation to FIG. 6 at the part of the front face FA covering the trenches TR, but leaving exposed the future zones of contact CNT_P1 of the first semiconductor layer P1.

Another dry etching is time controlled to remove the thickness of the layers deposited on the first semiconductor layer P1 (that is to say the second semiconductor layer P2 and the second dielectric envelope D2) at the future zones of contact CNT_P1. A portion of the first semiconductor layer P1 is thus exposed and is used to create electric contact with the first semiconductor layer P1.

After the etching, the mask MS2 is, of course, removed, typically by a selective chemical reaction.

Alternatively, the steps described in relation to FIGS. 6 and 7 can be reversed, that is to say that the first etching, masked by the mask MS2 as described above, can be time controlled to only remove the second semiconductor layer P2 and the second dielectric envelope D2, thus leaving the first semiconductor layer P1 and the first dielectric envelope D1 on the entire surface of the front face FA.

Then, the second etching, masked by the mask MS12 as described above, can be time controlled to remove the residual structure (D1-P1) on the front face FA, while preserving the zone of contact CNT_P1 of the first semiconductor layer P1.

Moreover, the steps described above in relation to FIGS. 1 to 7 can be implemented in a manner dedicated to the creation of the capacitive element, or in a manner shared with method steps also provided in the manufacturing of the integrated circuit (for example, with respect to the manufacturing of other integrated circuit devices, such as transistor devices).

For example, the steps of forming the dielectric envelopes and semiconductor layer can be of the same nature, and repeated twice, in a manner dedicated to the formation of the capacitive element.

Alternatively, the steps described above in relation to FIGS. 1 to 7 can be adapted, in particular the steps of masking and etching of FIGS. 6 and 7, in order to be part of a manufacturing method comprising similar formations. For example, the first dielectric envelope D1 and the first semiconductor layer P1 could be formed conjointly with steps of forming tunnel dielectric and a floating-gate region of EEPROM memory cells, while the second dielectric envelope D2 and the second semiconductor layer P2 could be formed conjointly with steps of forming control-gate dielectric and a control-gate region of EEPROM memory cells. Alternatively, the second dielectric envelope D2 and the second semiconductor layer P2 can be formed conjointly with steps of forming a layer of gate dielectric of low-voltage transistors, for example intended to operate at voltages between 1.2V and 3V, located in a logic part of the integrated circuit, and steps of forming the gate regions of the low-voltage transistors. Also, the etching of the plurality of excavations in the form of trenches TR can be carried out simultaneously with an etching of trenches intended to house vertical-gate regions of buried access transistors of the memory cells. Of course, certain manufacturing steps can remain dedicated to the formation of the capacitive element or to the formation of the other elements of the circuit. The method for manufacturing the EEPROM memories can also be slightly adapted in order to allow a joint integration of the method for manufacturing the capacitive element.

In the devices resulting from such joint manufacturing methods, the elements formed by the same step consequently have first of all the same nature, that is to say that they have the same composition of materials in the same state (for example monocrystalline, polycrystalline or amorphous) and in the same proportions (for example the stoichiometry of an allow or the concentration of dopants), and secondly the same thickness (in particular with regard to the steps of forming by deposition or growth, but also the thickness in terms of depth of an implanted region, or the depth of a trench etched in a material of the same nature).

FIG. 8 illustrates an embodiment of a capacitive element CAP with a high capacitive density, obtained by the method described above in relation to FIGS. 1 to 7.

The implementation of the capacitive element CAP results from steps of typical finalizations, starting from the result described in relation to FIG. 7 (with the mask MS2 taken away).

An electric connection has in particular been formed between the second semiconductor layer P2 and the semiconductor substrate SUB, for example via a track of the first level of metal M1 of the integrated circuit CI.

In this respect, silicidation reactions allowed to form films of metal silicide (not shown) on zones of contact, in particular on an exposed part of the front face FA of the substrate SUB, and on top of the second semiconductor layer P2. Pillars of contacts CNT allow to electrically couple the semiconductor regions including the zones of contact with the first level of metal M1.

The metallic track in the first level of metal M1 connecting the second semiconductor layer P2 and the semiconductor substrate SUB thus forms the terminal of the first electrode E1 of the capacitive element CAP.

And, the zone of contact CNT_P1 of the first semiconductor layer P1, provided in the steps described in relation to FIGS. 6 and 7, allows to electrically couple a contact pillar CNT with the first semiconductor layer P1, and connected to a track of the first level of metal M1, thus forming the terminal of the second electrode E2 of the capacitive element CAP.

To summarize, the integrated circuit CI includes a semiconductor substrate SUB in which a plurality of excavations in the form of trenches TR are sunk perpendicularly to the front face FA (direction Z).

The excavations TR of the substrate SUB receive a capacitive element CAP of the MOS type (Metal Oxide Semiconductor) including a first electrode E1 electrically insulated from a second electrode E2 by a dielectric element.

The second electrode E2 includes the first semiconductor layer P1, covering the part of the front face FA and conforming to the sides FL1 and the bottoms FD1 of the trenches TR while leaving a free space EL inside each trench.

As for the first electrode E1, it includes the semiconductor substrate SUB and the second semiconductor layer P2 covering the part of the front face FA and filling the free spaces EL left inside each trench TR.

The dielectric element comprises on the one hand the first dielectric envelope D1 covering a part of the front face FA and conforming to the sides FL1 and the bottoms FD1 of the trenches TR, and the second dielectric envelope D2 between the first semiconductor layer P1 and the second semiconductor layer, covering the part of the front face FA and conforming to the sides FL2 and the bottoms FD2 of the free spaces EL left inside each trench TR.

In other words, the second electrode E2 is sandwiched between the semiconductor substrate SUB of the first electrode E1 on the one hand, and the second semiconductor layer P2 of the first electrode E1 on the other hand, and, in both cases, while following the shape of the excavations in the form of trenches TR of the substrate SUB.

Since the substrate SUB is conventionally p-type doped, the first electrode E1, comprising the substrate SUB, can be intended to be polarized at a ground reference voltage, and the second electrode E2 can be intended to be polarized at a positive voltage.

Consequently, between the first electrode E1 and the second electrode E2, a first capacitive interface C1 extends on the "outer" surface of the trenches, that is to say the surface formed by the sides FL1 and the bottoms FD1 of the trenches TR; and a second capacitive interface C2 extends on an "inner" surface of the trenches, that is to say the surface formed by the sides FL2 and the bottoms FD2 of the free spaces EL inside each trench TR (having a shape homothetic to the "outer" surface of the trenches).

Thus, the size of the capacitive interface is defined on the one hand between the substrate SUB and the first semiconductor layer P1 (C1), already maximized by vertical portions on the sides FL1 of the trenches, and on the other hand between the first semiconductor layer P1 and the second semiconductor layer P2 (C2), also maximized by the vertical portions on the sides FL2 of the spaces left free EL inside the trenches.

First results allowed to obtain a capacitive density of the capacitive element CAP descried in relation to FIG. 8 with values greater than 50 fF/$\mu m^2$ (femtofarads per square micrometer) and even of 75 fF/$\mu m^2$ to 100 fF/$\mu m^2$.

Moreover, the semiconductor substrate SUB can optionally include a doped region IMP having a type of conductivity opposite to the type of conductivity of the substrate SUB, locally at said front face FA of the substrate.

The method described above in relation to FIGS. 1 to 7 can provide, in this respect, a step of implantation of dopants IMP having a type of conductivity opposite to the type of conductivity of the semiconductor substrate SUB, locally at said front face FA of the substrate, for example before the etching of the trenches TR described in relation to FIG. 1.

For example, the implantation of the doped region IMP can be implemented conjointly with an implantation step also provided in the method for manufacturing the integrated circuit, in particular such as during the formation of a "counter-implant" region provided in a tunnel (or Fowler-Nordheim) injection zone of a memory cell of the EEPROM type.

The doped region IMP allows for the formation of a source of minority carriers in the semiconductor substrate, which improves the behavior of the MOS capacitive element in inversion mode.

FIG. 9 illustrates an example of a top view of the capacitive element CAP described in relation to FIG. 8, where the same elements carry the same references and will not be described in detail again here. The orientation of the reference frame X-Y-Z in the view of FIG. 9 corresponds to the orientation of the reference frame X-Y-Z in the view of FIG. 8.

In this example, the capacitive element CAP is integrated into an elementary component CMP_EL.

Contrary to the representations simplified by conciseness of FIGS. 1 to 8, FIG. 9 shows that the plurality of trenches TR is provided in such a way as to maximize the density on an elementary surface of the elementary component CMP_EL.

The elementary component CMP_EL can be of the type standard cell (otherwise designated as "pre-characterized cell") belonging to a library of elementary and standardized cells intended to be assembled by designers of integrated circuits, and provided to be compatible, in practice, in the case of manufacturing of an assembly of cells.

Other types of elementary components exist, which can be called "slab", "tile" or "pixel", and have the same destination. For example, the size of the elementary component CMP_EL is approximately 10 μm*10 μm.

Moreover, the invention is not limited to these embodiments and implementations, but encompasses all the alternatives thereof, for example the width of the trenches and the thicknesses of the layers superimposed in the trenches could be different than the examples of values given above. In particular, the thicknesses could be finer, and/or the width of the trenches could be greater.

In which cases, the number of layers of dielectric and of semiconductor material superimposed and conforming together to the sides and the bottoms of the trenches could be increased, in order to multiple the number of capacitive interfaces inside each trench, between a first dielectric-semiconductor assembly creating the capacitive interface with the substrate and a last dielectric-semiconductor assembly completely filling each trench.

Figure 10:
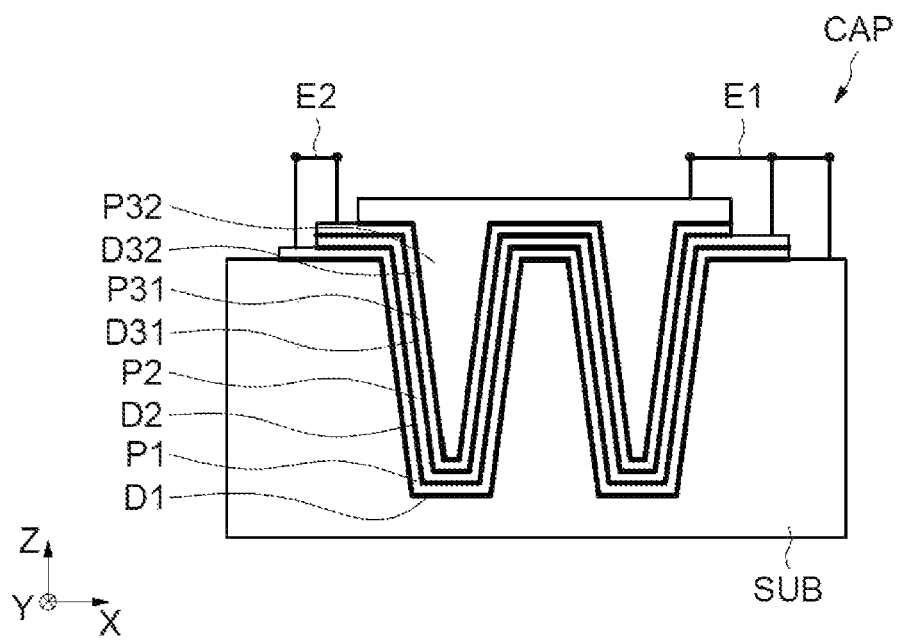
FIG. 10 shows an alternative of the example of the capacitive element of FIG. 8.

FIG. 10 shows an alternative of the example of FIG. 8, in which the second semiconductor layer P2 does not completely fill each trench, but conforms to the sides and the bottoms of the second dielectric envelope D2 while leaving a free space inside each trench. The capacitive element CAP further includes at least one third assembly of a dielectric envelope D31, D32 and of a semiconductor layer P31, P32 filling the free spaces left inside each trench. Each third assembly conforms to the sides and the bottoms of the third semiconductor layer of another third underlying assembly inside each trench (with the exception of the first third assembly D31, P31 located on the second semiconductor layer P2), and leaves a free space inside each trench (except for a last third assembly D32, P32, the semiconductor layer P32 of which completely fills each trench).

Each semiconductor layer P1, P2, P31, P32 would thus be alternatively electrically coupled to one and the other of the two electrodes E1, E2 of the capacitive element CAP, so that each one would be sandwiched on either side by semiconductor layers coupled to the other electrode.

Figure 11:
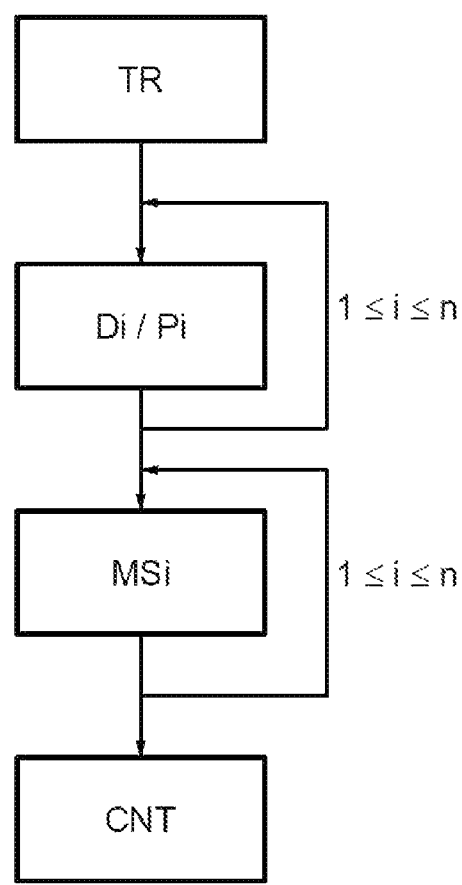
FIG. 11 illustrates an example of a manufacturing method adapted to the alternative of FIG. 10.

FIG. 11 illustrates an example of a manufacturing method adapted to the alternative of FIG. 10. The method comprises a step of etching trenches TR similar to the step described above in relation to FIG. 1, with for example a trench width LTR (FIG. 1) chosen at a value allowing to receive for example four assemblies, each of a dielectric layer D1, D2, D31, D32 and a semiconductor layer P1, P2, P31, P32.

The method then includes a repetition of steps of formation of the assemblies of a dielectric layer Di and of a semiconductor layer Pi, iterated using the index i ranging from 1 to n (for example i=1; 2; 31; 32, in correspondence with FIG. 10).

Each formation of the assemblies of a dielectric layer Di and of a semiconductor layer Pi is for example implemented in the manner described in relation to FIGS. 2 and 3, the last iteration corresponding to the implementation described in relation to FIGS. 4 and 5.

Steps of masking MSi, here again repeated iteratively using the index i, can be configured in relation to each assembly Di/Pi in order to provide zones of contact, in a similar manner to the steps described in relation to FIGS. 6 and 7.

A step CNT of connection is then provided to electrically connect each semiconductor layer with the respective electrodes E1, E2. In the order of their formation, each semiconductor layer is coupled alternatingly to the second electrode E2 and to the first electrode E1, the substrate being coupled to the first electrode E1.

Of course, the number of assemblies of a dielectric layer Di and of a semiconductor layer Pi can be less than 4, that is to say equal to 3, or greater than 4. The thickness of the trenches can be chosen in this respect according to the thicknesses of the semiconductor layers P1, P2, P31, P32.

The invention claimed is:

1. A method for manufacturing an integrated circuit that includes a capacitive element and a non-volatile memory cell comprising a transistor having a floating gate and a control gate, comprising:
   etching, in a semiconductor substrate, a plurality of excavations to form trenches sunk into the semiconductor substrate substantially perpendicularly to a front face of the semiconductor substrate;
   forming a first dielectric layer covering a part of the front face and conforming to sides and bottoms of the trenches, said first dielectric layer providing a first dielectric envelope for the capacitive element and a tunnel dielectric for the floating gate of the transistor for the non-volatile memory cell;
   forming a first semiconductor layer on the first dielectric layer, covering the part of the front face and conforming to a surface of the first dielectric layer in each trench while leaving a free space inside each trench, said first semiconductor layer providing a first capacitor electrode of the capacitive element and the floating gate of the transistor for the non-volatile memory cell;
   forming a second dielectric layer covering the first semiconductor layer on the part of the front face and conforming to a surface of first semiconductor layer in the free space left inside each trench, said second dielectric layer providing a second dielectric envelope for the capacitive element and a dielectric for the control gate of the transistor for the non-volatile memory cell; and
   forming a second semiconductor layer covering the second dielectric layer, said second semiconductor layer providing a second capacitor electrode of the capacitive element and the control gate of the transistor for the non-volatile memory cell.

2. The method of claim 1, wherein said trenches have a depth in the semiconductor substrate that is explicitly between 500 nm and 1200 nm.

3. The method of claim 1, wherein the second semiconductor layer fills the free space left inside each trench.

4. The method of claim 1, further comprising electrically connecting the second semiconductor layer to the semiconductor substrate for the capacitive element.

5. The method of claim 1, further comprising implanting dopants having a first type of conductivity opposite to a second type of conductivity of the semiconductor substrate at the front face of the semiconductor substrate and around the trenches.

6. The method of claim 5, wherein implanting dopants comprises simultaneously implanting dopants near a drain region associated with the transistor for the non-volatile memory cell.

7. The method of claim 1, wherein each trench has a width and wherein the trenches are spaced apart from each other by a distance, and wherein said width and distance are substantially equal to each other.

8. The method of claim 7, wherein the width is between 100 nanometers and 300 nanometers.

9. The method of claim 7, wherein the distance is between 100 nanometers and 300 nanometers.

10. The method of claim 1, wherein the first dielectric layer is formed from silicon dioxide.

11. The method of claim 1, wherein the second dielectric layer is formed from silicon dioxide.

12. The method of claim 1, wherein the first and second semiconductor layers are each formed from polycrystalline silicon.

13. The method of claim 1, wherein said non-volatile memory further includes an access transistor, and wherein etching the plurality of excavations further comprises forming a trench for a vertical gate region of the access transistor.

14. The method of claim 1, wherein the integrated circuit further includes a logic part with a logic transistor having a gate, and wherein second dielectric layer provides a dielectric for the gate of the logic transistor, and wherein said second semiconductor layer providing the gate of the logic transistor.

15. The method of claim 1, wherein the second semiconductor layer conforms to the second dielectric layer to leave a further free space inside each trench, further comprising:
 forming a third dielectric layer covering the second semiconductor layer on the part of the front face and conforming to a surface of second semiconductor layer in the further free space left inside each trench, said third dielectric layer providing a third dielectric envelope for the capacitive element; and
 forming a third semiconductor layer covering the third dielectric layer, said third semiconductor layer providing a third capacitor electrode of the capacitive element.

16. The method of claim 15, further comprising electrically connecting the first and second semiconductor layers for the capacitive element.

17. The method of claim 16, wherein the third semiconductor layer completely fills said further free space left inside each trench.

18. The method according to claim 16, wherein the third semiconductor layer does not completely fill said further free space left inside each trench.

* * * * *

UNITED STATES PATENT AND TRADEMARK OFFICE
CERTIFICATE OF CORRECTION

| | | |
|---|---|---|
| PATENT NO. | : 12,057,513 B2 | Page 1 of 1 |
| APPLICATION NO. | : 18/210155 | |
| DATED | : August 6, 2024 | |
| INVENTOR(S) | : Christian Rivero et al. | |

It is certified that error appears in the above-identified patent and that said Letters Patent is hereby corrected as shown below:

In the Specification

At Column 6, Line 3, [[ etching (ME) type. ]] should be corrected to read -- etching (RIE) type. --

Signed and Sealed this
Eleventh Day of November, 2025

John A. Squires
*Director of the United States Patent and Trademark Office*